United States Patent [19]
Gebert et al.

[11] Patent Number: 4,750,207
[45] Date of Patent: Jun. 7, 1988

[54] HEARING AID NOISE SUPPRESSION SYSTEM

[75] Inventors: Anton M. Gebert; Yuri Gokhin, both of Union, N.J.

[73] Assignee: Siemens Hearing Instruments, Inc., Union, N.J.

[21] Appl. No.: 846,662

[22] Filed: Mar. 31, 1986

[51] Int. Cl.$^4$ .................. H04R 25/00; H04R 3/04; H04B 15/00

[52] U.S. Cl. .................. 381/68.4; 381/68.2; 381/94

[58] Field of Search .................. 381/68, 94, 71, 101, 381/102, 68.2, 68.4; 179/107 R, 107 FD

[56] References Cited

U.S. PATENT DOCUMENTS

| | | | |
|---|---|---|---|
| 3,611,145 | 10/1971 | O'Connor | 381/94 |
| 3,678,416 | 7/1972 | Burwen | 381/94 |
| 3,927,279 | 12/1975 | Nakamura et al. | 381/68.2 |
| 3,928,733 | 12/1975 | Hueber | 381/94 |
| 4,061,875 | 12/1977 | Freifeld et al. | 381/72 |
| 4,363,006 | 12/1982 | Ishigaki | 381/94 |
| 4,405,831 | 9/1983 | Michelson | 381/68.4 |
| 4,419,544 | 12/1983 | Adelman | 381/68.4 |
| 4,425,481 | 1/1984 | Mansgold et al. | 381/68.2 |
| 4,490,585 | 12/1985 | Tanaka | 381/68 |
| 4,506,381 | 3/1985 | Ono | 381/94 |
| 4,517,415 | 5/1985 | Laurence | 381/68.4 |
| 4,622,692 | 11/1986 | Cole | 381/68 |
| 4,630,302 | 12/1986 | Kryter | 381/68.4 |

FOREIGN PATENT DOCUMENTS

| | | |
|---|---|---|
| 3139088 | 4/1983 | Fed. Rep. of Germany . |
| 3237988 | 5/1983 | Fed. Rep. of Germany . |
| 55-27742 | 2/1980 | Japan . |
| 59-8500 | 1/1984 | Japan . |
| 723791 | 3/1980 | U.S.S.R. .................. 381/94 |

OTHER PUBLICATIONS

Ono, Hiroshi et al. "Clinical Results of Hearing Aid with Noise Level Controlled Selective Amplification", *Audiology* 22 pp. 494–515, 1983.

Kates, James M. "Signal Processing for Hearing Aids", *Hearing Instruments*, Feb. 1986, pp. 19–22.

WO83/02862, Håkansson, Bo, "A Method and a Device for Damping of Transients", 18 Aug. 1983.

*Primary Examiner*—Jin F. Ng
*Assistant Examiner*—Danita R. Bryd
*Attorney, Agent, or Firm*—Mark H. Jay

[57] ABSTRACT

A hearing aid responds to increased noise by changing its frequency response to reduce the effects of the noise. The hearing aid has a circuit which varies the frequency response of the unit as a function of low-frequency sounds, using a fast attack time and a much slower release time.

3 Claims, 4 Drawing Sheets

HEARING AID NOISE SUPPRESSION SYSTEM

BACKGROUND OF THE INVENTION

The invention relates to hearing aids, and more particularly relates to hearing aids of the type which respond to changes of noise levels in the user's sound environment.

It is known that the performance of a hearing aid improves when its frequency response changes with the ambient noise level. This can be done, for example, by monitoring the sound environment for the presence of low-frequency sounds, which are present in noisy environments. In devices of this type, the frequency response of the hearing aid is changed so that the device becomes less responsive to low-frequency sounds as those sounds become louder, and vice versa. This blocks out the noise and improves intelligibility for the user.

However, these known devices are difficult to use. This is because known hearing aids respond to short-duration sounds, thereby causing uncomfortable rapid fluctuations of the signal level when the noise level changes.

It would be advantageous to provide a hearing aid which provided a noise suppression feature that was nonetheless comfortable for a user.

One object of the invention is to provide a hearing aid which has a variable frequency response to improve intelligibility in high noise environments which is nonetheless comfortable for use.

Another object is, in general, to improve on known devices of this type.

SUMMARY OF THE INVENTION

In accordance with the invention, the frequency response of the hearing aid is varied in accordance with the presence and absence of low-frequency sounds in the user's sonic environment. Further in accordance with the invention, the hearing aid responds more quickly to increases in noise level and much more slowly to decreases in noise level. This gives a user's auditory system time to adapt to the changed frequency response of the hearing aid while still preserving intelligibility in the presence of high noise levels.

In a preferred embodiment, the hearing aid has a filter capacitor through which the signal from the microphone passes before entering the amplifier. The filter capacitor is shunted by a resistive path of variable resistance; this path is preferably the collector-emitter path of a transistor whose conductive state is determined by the presence of low-frequency sounds present at the microphone. Further advantageously, the base of the transistor is connected to a charging capacitor which charges more quickly with increased noise levels and which discharges only much more slowly when the noise levels decrease. This gives the system the desired faster attack time (to increase intelligibility in the presence of noise) and much slower release time (to give the user's auditory system the opportunity to adapt and therefore to increase comfort) when the noise level diminishes.

BRIEF DESCRIPTION OF THE DRAWINGS

Exemplary and non-limiting preferred embodiments of the invention are shown in the drawings, in which.

DETAILED DESCRIPTION OF PREFERRED EMBODIMENTS

Figure 1:
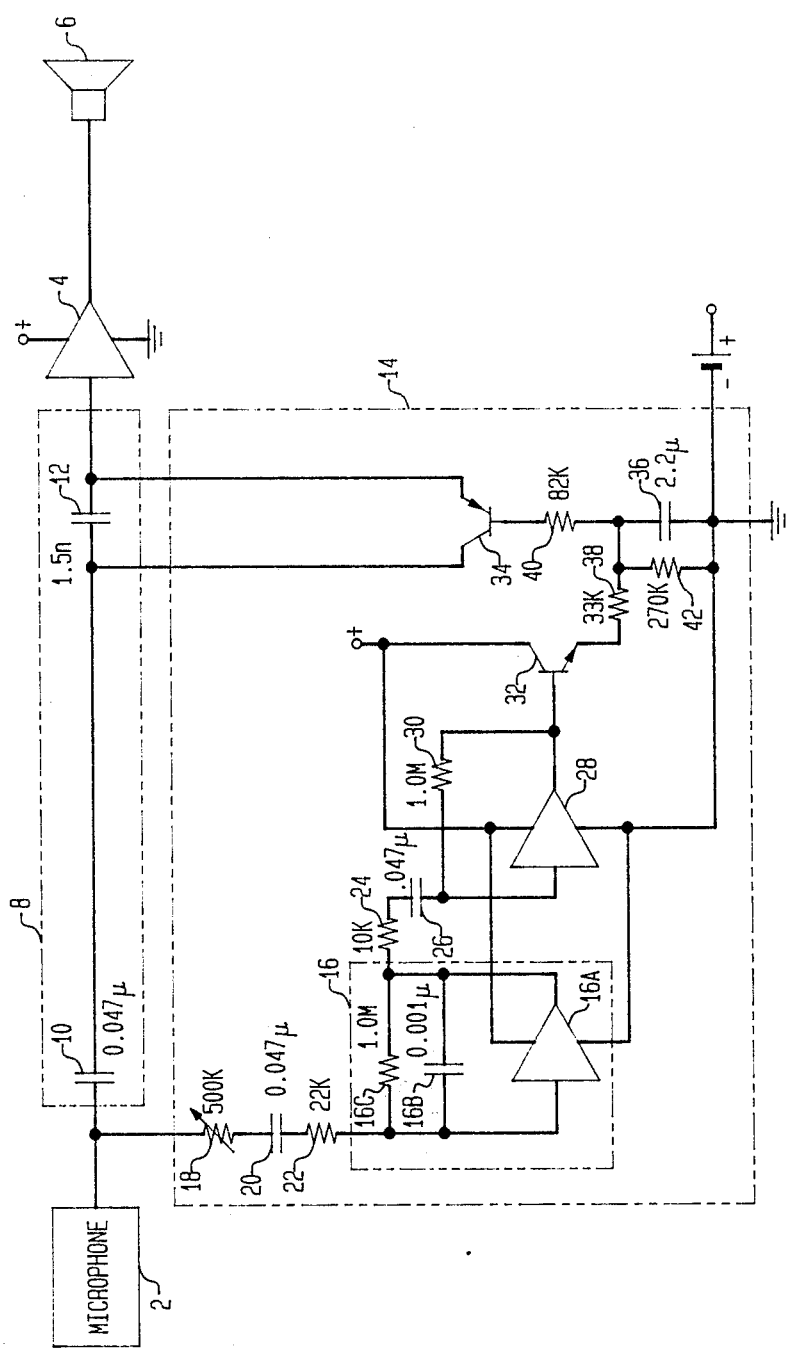
FIG. 1 is a diagram of an in-the-ear hearing aid in accordance with the invention.

A hearing aid contains a microphone 2, a power amplifier 4, and a receiver 6 which functions as a loudspeaker. Between the microphone 2 and the power amplifier 4 is an adjustable high-pass filter 8 made up of two series-connected capacitors 10 and 12.

The frequency response of this system is determined by the characteristics of the filter 8. As will be explained below, the impedance of this filter 8, and therefore the frequency response of the whole system, is varied by shunting across the capacitor 12 with a variable resistance determined by the presence of noise at the microphone 2. The mechanics by which such variation is accomplished will now be discussed.

A circuit 14 is used to carry this variation out. Within the circuit 14, there is contained an active low frequency bandpass filter 16, which identifies noise (here, low-frequency sounds from 500 Hz down to 150 Hz) at the microphone 2. The bandpass filter 16 in this example is made up of an operational amplifier 16A whose output and inverting input are bridged by a parallel RC network which includes capacitor 16B and resistor 16C. The input of the operational amplifier 16A, and therefore of the bandpass filter 16, is connected to the microphone 2 through a series circuit which includes a potentiometer 18, a capacitor 20, and a resistor 22. The potentiometer 18 is used to set the level of the circuit 14.

Sounds within the frequency band passed by the bandpass filter 16 are then routed to the input of an operational amplifier 28 through a series RC circuit which includes a resistor 24 and capacitor 26. The operational amplifier 28 is connected as a conventional driver amplifier with a resistance 30 between its output and inverting intput.

The operational amplifier 28 appropriately biases the base-emitter circuit of an NPN transistor 32, whose collector is connected to the voltage source. The transistor 32 is biased in such a way that it rectifies the signal at the output of the operational amplifier 28. (Rectification is necessary so as not to discharge the capacitor 36 described below).

Current passing through the emitter of transistor 32 is used to control the conductive state of a PNP transistor 34 which has its collector-emitter circuit connected across the capacitor 12. This is done indirectly by using the current through the emitter of the transistor 32 to charge up a capacitor 36 and by making the conductive state of transistor 34 dependant upon the voltage across the capacitor 36.

Current passing through the emitter of the transistor 32 passes trough a resistor 38, which is connected to one plate of the capacitor 36. The other plate of the capacitor 36 is grounded. The ungrounded plate of capacitor 36 is connected to the base of transistor 34 through a resistor 40 and a resistor 42 shunts across the capacitor 36.

When current flows through the emitter of transistor 32, the current passes through resistor 38 and charges capacitor 36. As the voltage across capacitor 36 increases, the voltage difference between the base and the emitter of transistor 34 also decreases, making the transistor 34 less conductive. This has the effect of shunting the capacitor 12 with a resistor of increasing resistance.

When current flow trough the emitter of transistor 32 decreases, the capacitor 36 then discharges through the resistor 42. This reduces the voltage across the capacitor 36, reduces the voltage at the base of transistor 34, increases the voltage across the emitter-base junction of transistor 34, and makes transistor 34 more conductive. This has the effect of placing a resistive shunt of decreasing resistance across capacitor 12.

Thus, the circuit 14 responds to low-frequency noise at the microphone 2 by keeping the high-pass filter 8 in its highest-pass state. This is because a large quantity of noise at the microphone 2 will tend to keep the capacitor 36 charged up, rendering the transistor 34 entirely non-conductive and placing an open resistive circuit across the capacitor 12. However, as the noise at microphone 2 decreases, the current flow through the transistor 32 decreases, the charge across the capacitor 36 decreases, the transistor 34 becomes more conductive, and the effect of the capacitor 12 becomes less and less important to the high-pass filter 8. In this way, the frequency response of the system is adapted to the noise in the user's environment; the system becomes less responsive to low frequencies as the low frequencies become more predominant.

The resistance of resistor 38 is much less than the resistance of the resistor 42. This has the effect that increased noise levels at the microphone 2 cause the capacitor 36 to charge up more rapidly than it can discharge when the noise level at the microphone 2 decreases. The effect of this electrical characteristic is that when noise at the microphone 2 rises, the system soon becomes less responsive to noise so that intelligibility is maintained. However, when the ambient noise level drops, the increased low-frequency response of the system is phased in over a much longer period of time, to permit the user's hearing system to adjust. This type of response is known to persons skilled in the art as a faster attack time and a much slower release time. In this example, the attack time is approximately 1/10 Y.G. as long as the release time. It should be noted that the attack time, while fast in comparison to the release time, is not fast in the absolute sense. This is so that the hearing aid does not respond to short, momentary noise lasting less than perhaps 50 ms.

Figure 2:
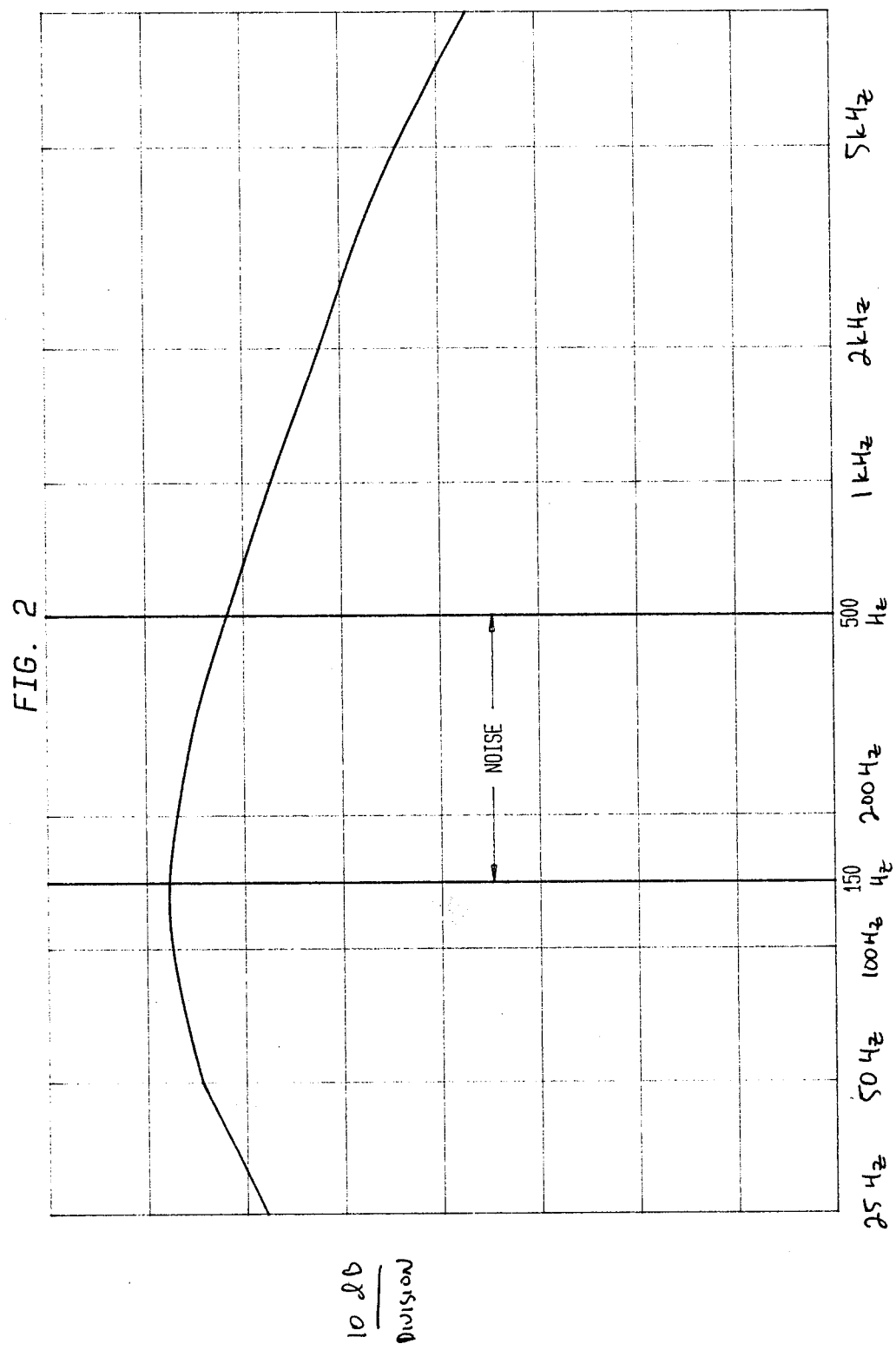
FIG. 2 illustrates the response of a typical bandpass filter in the preferred embodiment.

The response of the bandpass filter 16 in this example is illustrated in FIG. 2. This indicates that "noise" is defined as sounds having frequencies in the band between 500 Hz and 150 Hz. While this particular response is desired, it is not necessary for the practice of the invention and the width, shape and actual location of the band which is passed by the bandpass filter 16 can be changed.

Figure 3:
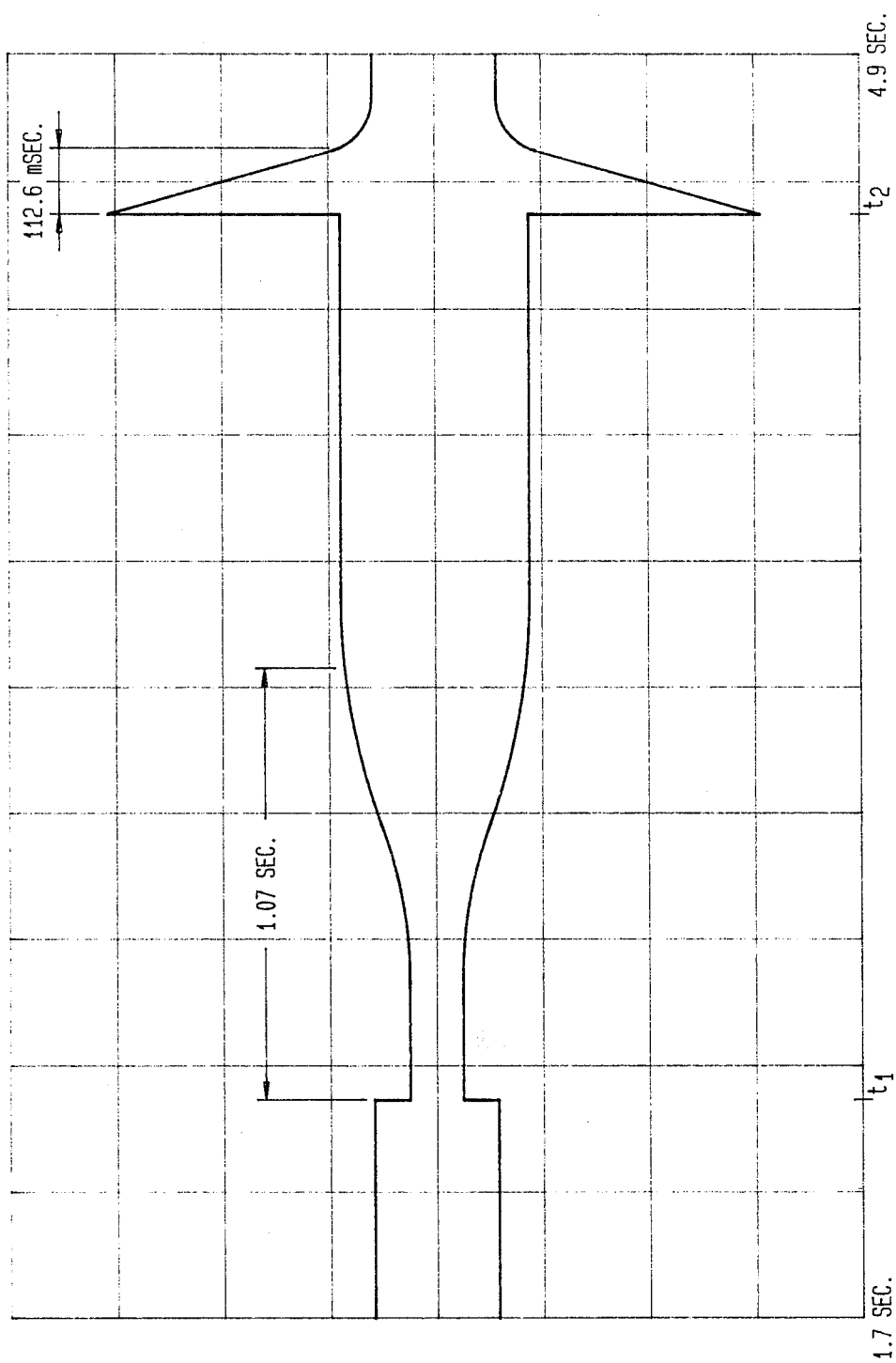
FIG. 3 illustrates a typical faster attack time and slower release time in accordance with the invention.

FIG. 3 illustrates the response of the invention to changes in the amount of 250 Hz noise at the input of the circuit 14. At time $t_1$, the quantity of noise is abruptly reduced. This shows that the gain of the system is cut down but then slowly rises once again until the high-pass filter 8 has reached its least high-pass state. When, at time $t_2$, the amount of noise is abruptly increased, the system responds with a faster attack time to put a rapid clamp on the response of the circuit to the noise by shifting the frequency response of the high-pass filter upward. The attack time constant of approximately 70 msec gives the circuit the same loudness integration behavior as the human auditory system. The ear has a temporal integration time constant in the range of 50 to 100 msec.

Figure 4:
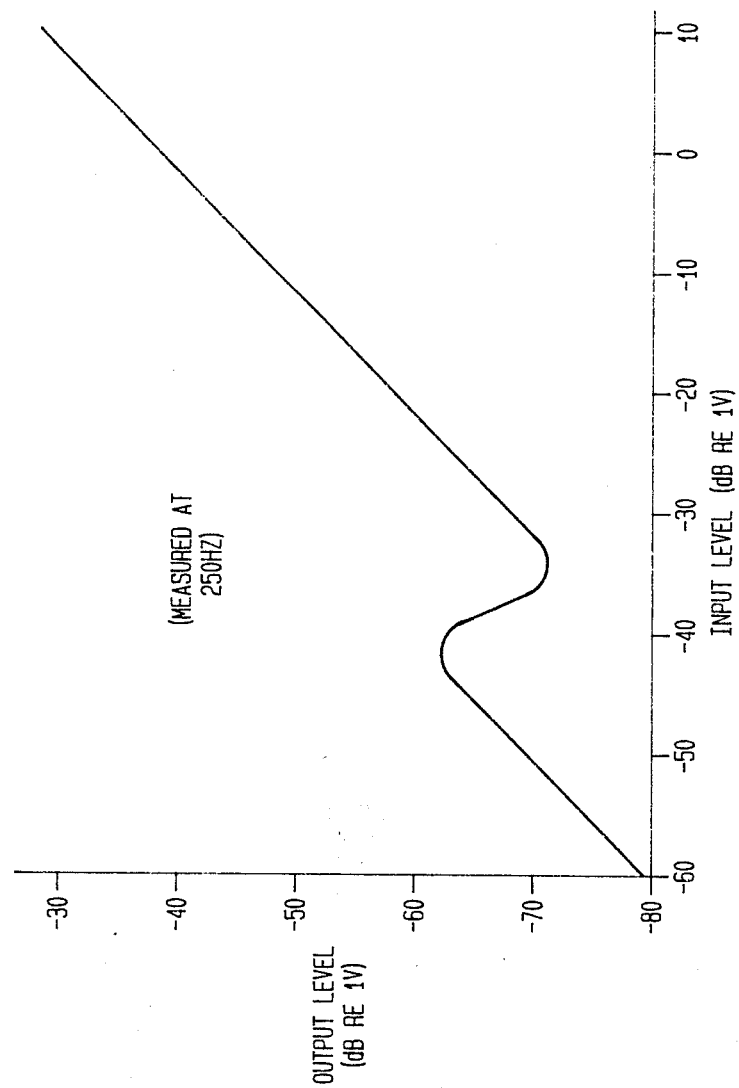
FIG. 4 illustrates a typical response of the invention to increased noise levels.

FIG. 4 shows the overall response of the invention to a 250 Hz signal. This indicates that the response of the system begins to drop at approximately 40 db below 1 V and only begins rising at about 47 db. This curve can be shifted up and down by adjusting the potentiometer 18.

Those skilled in the art will understand that changes can be made in the preferred embodiments here described, and that these embodiments can be used for other purposes. Such changes and uses are within the scope of the invention, which is limited only by the claims which follow.

We claim:

1. A hearing aid circuit, comprising:
    a high-pass filter with adjustable frequency response;
    a bandpass filter; and
    an attack and release circuit connecting the bandpass filter to the high-pass filter in a manner that an increased output from the bandpass filter changes the frequency response of the high-pass filter after an attack time and a decreased output from the bandpass filter changes the frequency response of the high-pass filter after a release time which is much longer than said attack time.

2. The hearing aid circuit of claim 1, wherein said high-pass filter comprises a filter capacitor and said attack and release circuit comprises a transistor with its collector-emitter circuit shunting said filter capacitor.

3. The hearing aid circuit of claim 2, wherein said attack and release circuit further comprises a timing capacitor which is connected to the base of said transistor, a charging resistor through which said timing capacitor is clamped, and a discharging resistor thereof which said timing capacitor is discharged, said charging resistor having a lower resistance than said discharging resistor.

* * * * *